United States Patent
Thalmann

(10) Patent No.: US 7,143,325 B2
(45) Date of Patent: Nov. 28, 2006

(54) METHOD FOR TESTING CIRCUIT UNITS TO BE TESTED BY MEANS OF MAJORITY DECISIONS AND TEST DEVICE FOR PERFORMING THE METHOD

(75) Inventor: Erwin Thalmann, Villach (AT)

(73) Assignee: Infineon Technologies AG, Munich (DE)

( * ) Notice: Subject to any disclaimer, the term of this patent is extended or adjusted under 35 U.S.C. 154(b) by 211 days.

(21) Appl. No.: 10/957,205

(22) Filed: Oct. 1, 2004

(65) Prior Publication Data

US 2005/0108609 A1 May 19, 2005

(30) Foreign Application Priority Data

Oct. 2, 2003 (DE) ............... 103 45 977

(51) Int. Cl.
*G06F 11/00* (2006.01)
*G01R 31/28* (2006.01)
(52) U.S. Cl. .............. 714/736; 714/733; 714/734
(58) Field of Classification Search ............. None
See application file for complete search history.

(56) References Cited

U.S. PATENT DOCUMENTS

| | | | |
|---|---|---|---|
| 6,480,978 B1 | 11/2002 | Roy et al. | |
| 6,559,671 B1* | 5/2003 | Miller et al. | 324/765 |
| 2001/0025227 A1* | 9/2001 | Ajiro | 702/120 |
| 2002/0133774 A1* | 9/2002 | Inoue | 714/736 |
| 2003/0071649 A1 | 4/2003 | Dankowski et al. | |

FOREIGN PATENT DOCUMENTS

DE 101 50 441 A1 4/2003

* cited by examiner

*Primary Examiner*—Phung My Chung
(74) *Attorney, Agent, or Firm*—Maginot, Moore & Beck

(57) ABSTRACT

The invention provides a test device for testing circuit units ($101a$–$101n$) to be tested, having connecting units ($106a$–$106n$) for connecting the circuit units ($101a$–$101n$) to be tested to the test device, a test system (100) and an output unit (108) for outputting test result data, the test device having a determining unit (103) for determining those of the measurement data ($110a$–$101n$) which correspond for a predeterminable number of circuit units ($101a$–$101n$) to be tested, and for defining the corresponding measurement data ($110a$–$110n$) as the expected data (111); and comparison units ($104a$–$104n$) for comparing the measurement data ($110a$–$110n$) generated by the circuit units ($101a$–$101n$) to be tested in a manner dependent on the test data (112) written in with the expected data (111) in order to obtain comparison data ($115a$–$115n$).

16 Claims, 2 Drawing Sheets

METHOD FOR TESTING CIRCUIT UNITS TO BE TESTED BY MEANS OF MAJORITY DECISIONS AND TEST DEVICE FOR PERFORMING THE METHOD

FIELD OF THE INVENTION

The present invention generally relates to test devices for testing circuit units to be tested, and relates in particular to a test device and a method for testing circuit units to be tested in the test device, in the case of which predetermined test data are applied to the circuit units to be tested, the measurement data of the circuit units to be tested, which are obtained in a manner dependent on the predetermined test data, being compared with known expected data (desired data).

BACKGROUND

Specifically, the present invention relates to a test device for testing circuit units to be tested, which has connecting units for connecting the circuit units to be tested to the test device and a test system, which writes test data to the circuit units to be tested and reads out measurement data generated by the circuit units to be tested in a manner dependent on the test data written in, the measurement data read out being compared with defined expected data in such a way that test result data are provided in a manner dependent on the comparison.

Testing of circuit units to be tested, which may be formed in particular as electronic semiconductor circuits (chips), is associated with rising test costs in conjunction with an increasing test complexity. Such costs depend inter alia on the following factors:

(i) test duration, i.e. time during which the chip or the circuit unit to be tested is tested; and (ii) number of simultaneously testable chips.

If the number of simultaneously testable chips or circuit units to be tested is increased, test costs can be lowered.

It is disadvantageous that the number of simultaneously testable chips that can be connected to a test system is limited. Circuit units to be tested have connecting units comprising specific tester channels. Each individual tester channel must be connected to the test system. It is disadvantageous that the number of tester channels provided by a test system is limited.

Thus, a number of n connecting units is required for testing n circuit units to be tested. Each of the n connecting units in turn has m tester channels, with the result that a total number of n×m tester channels have to be provided in order that n circuit units to be tested are tested in parallel. Consequently, conventional test systems have the disadvantage that a parallelism when testing the circuit units to be tested in a test device is limited the number of tester channels provided in the test device.

In order to solve this problem, it has been proposed to increase a parallelism when testing circuit units to be tested by a procedure in which driver lines of different circuit units to be tested are used simultaneously. This is possible since signals are transmitted on the driver lines only from the test system of the test device to the circuit unit to be tested. This is possible in particular when the signals on the driver lines have an identical function.

SUMMARY

DE 101 50 441 A1 discloses a method for testing semiconductor circuit devices in which a plurality of identical semiconductor circuit devices can be tested in a particularly rapid and reliable manner by the tests being fed to the plurality of semiconductor circuit devices in parallel and essentially simultaneously, driver lines—used in the process—from a test device to the semiconductor circuit devices being used simultaneously and jointly for all the semiconductor circuit devices.

In this case, those lines which transmit signals from the test device to the semiconductor circuit device are used multiply by the semiconductor circuit devices. The multiply used lines comprise, in particular, address lines and control lines, i.e. in particular the address bus and the control bus of the semiconductor circuit devices.

It is disadvantageous that the method of DE 101 50 441 A1 does not provide an increase in a parallelism with regard to the data lines that are routed between the test device and the semiconductor circuit device. A joint use of data lines for a plurality of semiconductor circuit devices to be tested is conventionally impeded by the fact that on the data lines, signals have to be passed both from the test device to the semiconductor circuit device to be tested and conversely from the semiconductor circuit device to be tested to the test device.

Such data tester channels which transmit signals in both directions, such as e.g. data lines, cannot be shared by a plurality of circuit units to be tested because signal collisions would occur.

FIG. 3 shows a conventional test device having a test system, to which circuit units DUT1, DUT2 . . . DUTn to be tested are connected via an address bus, a control bus and a data bus. As mentioned, conventional methods make it possible to parallelize the signals of the address bus and control bus, i.e. to multiply use the lines of the address bus and of the control bus from the test system to the circuit units to be tested.

It is disadvantageous that on the data bus, signals are transmitted in both directions, i.e. from the test system to the circuit units to be tested and back from the circuit units to be tested to the test system, which is illustrated by a double arrow in FIG. 3. It is disadvantageous that it is not possible to increase a parallelism of the test system through a joint use of data bus lines, since signal collisions can occur in the event of writing data to the circuit units to be tested and in the event of reading out data from the circuit units to be tested.

It should be pointed out that the circuit units DUT1, DUT2 . . . DUTn to be tested which are shown are connected to the test system via tester channels, it being necessary in each case to provide a number of m tester channels for a circuit unit to be tested. An essential disadvantage of the test device shown in FIG. 3 thus consists in the fact that the tester channels that relate to the data bus cannot be parallelized and, consequently, it is not possible to reduce the number of tester channels per circuit unit to be tested.

Therefore, it is an object of the present invention to provide a test device for testing circuit units to be tested and a corresponding test method in the case of which parallelism when testing a plurality of circuit units to be tested is increased compared with devices and methods according to the prior art.

This object is achieved according to the invention for a device with the features of patent claim 1.

Furthermore, the object is achieved by means of a method specified in patent claim 10.

Further refinements of the invention emerge from the subclaims.

An essential concept of the invention consists in providing a parallelization of the data bus by virtue of the fact that signals are transmitted on the data bus between a test system and the circuit units to be tested only in one direction in the complete width to each individual circuit unit to be tested, while a test result is no longer analyzed by each individual circuit unit to be tested.

In this case, it is advantageous that an expected value with which measurement data of the circuit units to be tested are compared is not provided in the test system, but rather is obtained by a majority decision with regard to the measurement data that are supplied by the circuit units to be tested and are read out from the latter.

Said expected value is determined by a determining unit that is additionally provided and is compared in comparison units that are additionally provided for each individual circuit unit to be tested with the measurement data read out from the latter.

The expected data provided by a majority decision in the determining unit advantageously correspond to the expected data provided by the test system if a plurality of the circuit units to be tested operate correctly and thus supply correct measurement data. It has expediently been found in practical tests that component tests are performed in the case of semiconductor memories, for example, the proportion of functional components lying in a range of greater than 80%. The expected data obtained by a majority decision can then advantageously be used for testing the rest of the circuit units to be tested with regard to their functionality.

The data bus provided in the test device can then be almost entirely parallelized, i.e. signals are only transmitted from the test system to the circuit units to be tested. This advantageously enables a considerable increase in the parallelism when testing circuit units to be tested.

The test device according to the invention for testing circuit units to be tested essentially has:

a) connecting units for connecting the circuit units to be tested to the test device;

b) a test system, which writes test data to the circuit units to be tested, reads out measurement data generated by the circuit units to be tested in a manner dependent on the test data written in, and compares the measurement data read out with defined expected data and provides test result data in a manner dependent on the comparison; and c) an output unit for outputting the test result data, the test device further having a determining unit for determining those of the measurement data which correspond for a predeterminable number of circuit units to be tested, and for defining the corresponding measurement data as the expected data, and comparison units for comparing the measurement data generated by the circuit units to be tested in a manner dependent on the test data written in with the expected data in order to obtain comparison data.

Furthermore, the test method according to the invention for testing circuit units to be tested in a test device essentially has the following steps:

a) connection of the circuit units to be tested to the test device by means of connecting units;

b) performance of test procedures by means of a test system, the test system writing test data to the circuit units to be tested, reading out measurement data generated by the circuit units to be tested in a manner dependent on the test data written in and comparing the measurement data read out with defined expected data and providing test result data in a manner dependent on the comparison; and c) outputting of the test result data by means of an output unit, it further being the case that those of the measurement data which correspond for a predeterminable number of circuit units to be tested are determined by means of a determining unit, the corresponding measurement data are defined as the expected data by means of the determining unit, and the measurement data generated by the circuit units to be tested in a manner dependent on the test data written in are compared with the expected data by means of comparison units in order to obtain comparison data.

Advantageous developments and improvements of the respective subject matter of the invention are found in the subclaims.

In accordance with one preferred development of the present invention, the connecting units for connecting the circuit units to be tested to the test system of the test device in each case comprise a predetermined number m of tester channels.

Preferably, the test system of the test device provides n×m tester channels if n corresponds to the number of circuit units to be tested.

In accordance with a further preferred development of the present invention, the predeterminable number of circuit units to be tested for which the measurement data correspond, said predeterminable number being determined in the determining unit, comprises a majority of the circuit units to be tested. A majority decision with regard to the expected data determined is thereby advantageously provided.

In accordance with yet another preferred development of the present invention, provision is made of a buffer storage unit for buffer storing the expected data determined, the expected data determined being obtained from a majority decision that is performed by means of the determining unit.

In accordance with yet another preferred development of the present invention, in the test device, a multiplexing unit is provided, which switches through the test data to the circuit units to be tested and outputs to the corresponding comparison units the measurement data generated by the circuit units to be tested in a manner dependent on the test data switched through.

In accordance with yet another preferred development of the present invention, the multiplexing unit switches through the test data to the circuit units to be tested in a manner dependent on a write-read signal fed to the multiplexing unit. Preferably, the multiplexing unit furthermore outputs to the corresponding comparison units, in a manner dependent on the write-read signal fed to the multiplexing unit, the measurement data generated by the circuit units to be tested in a manner dependent on the test data switched through.

In accordance with yet another preferred development of the present invention, in the test device, provision is made of a comparison data storage unit for storing the comparison data from which the test result data are obtained.

In accordance with yet another preferred development of the present invention of the present invention, provision is made of at least three connecting units for connecting at least three circuit units to be tested to the test device, in order to expediently be able to bring about a meaningful majority decision in the determining unit.

BRIEF DESCRIPTION OF THE DRAWINGS

Exemplary embodiments of the invention are illustrated in the drawings and explained in more detail in the description below.

In the drawings.

In the figures, identical reference symbols designate identical or functionally identical components or steps.

DETAILED DESCRIPTION

Figure 1:
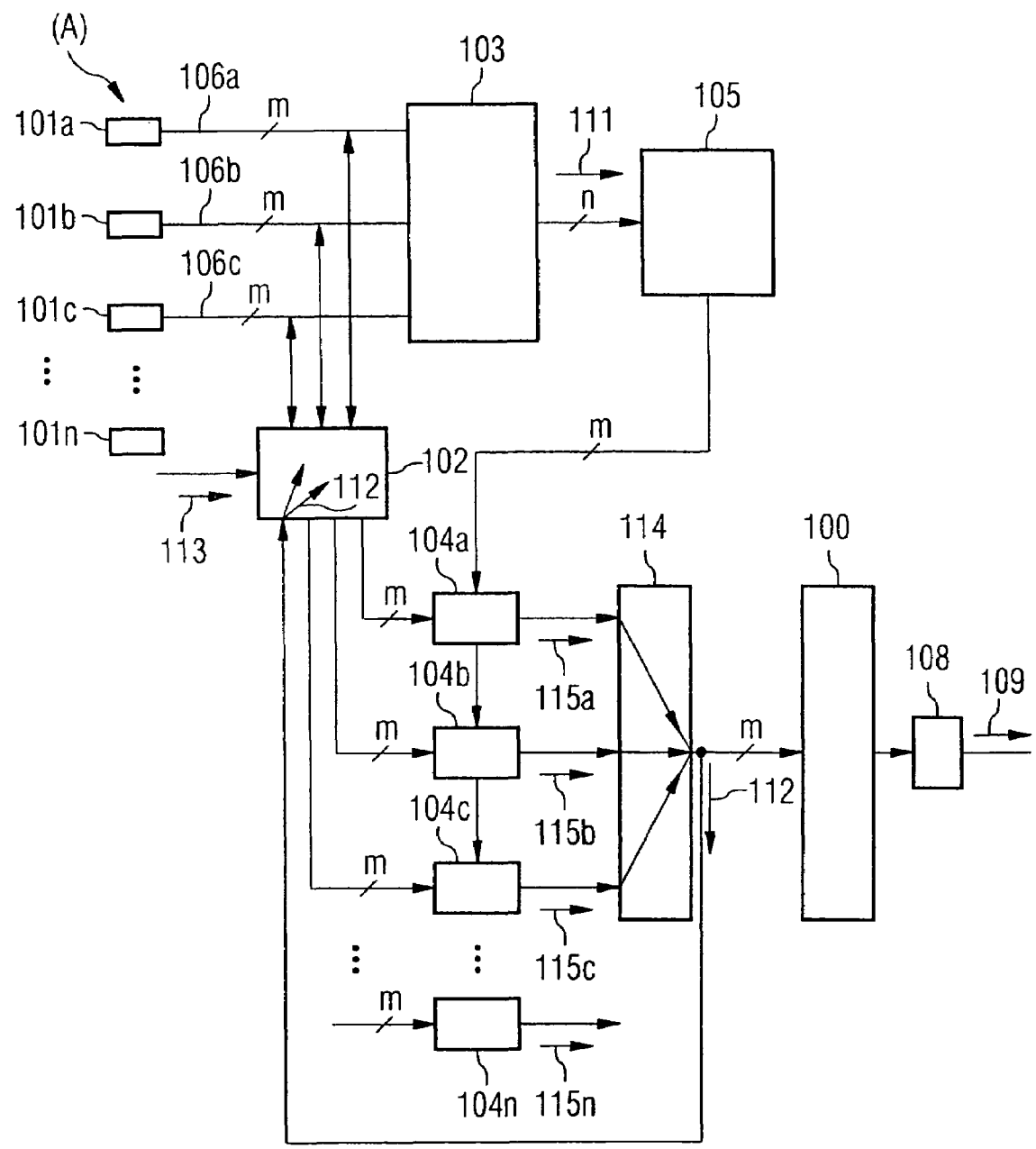
FIG. 1 shows a block diagram of a test device for testing circuit units to be tested in accordance with a preferred exemplary embodiment of the present invention.

FIG. 1 shows a block diagram of a test device according to the invention in accordance with a preferred exemplary embodiment of the present invention. A reference symbol 100 designates a test system, which writes test data to circuit units 101a–101n to be tested, reads out measurement data 110a–110n generated by the circuit units to be tested in a manner dependent on the test data written in, and compares the measurement data 110a–110n read out with defined expected data 111 and provides test result data 109 in a manner dependent on the comparison.

FIG. 1 shows that the circuit units 101a–101n to be tested are connected to the test device by means of connecting units 106a–106n. Although FIG. 1 shows three circuit units to be tested, in order to be able to perform the method according to the invention of a majority decision, the invention is not restricted to a connection of three circuit units 101a, 101b, 101c to be tested, rather it is clearly evident to average persons skilled in the art that any desired number of circuit units to be tested can be connected to the test device provided that it is possible to provide a sufficient number of tester channels 107a–107m for a specific circuit unit to be tested (also see description below with reference to FIG. 2).

In FIG. 1, m tester channels 107a–107m are provided per circuit unit 101a–101n to be tested, as explained below with reference to FIG. 2. According to the invention, test data 112 are fed into the circuit units 101a–101n to be tested via a multiplexing unit 102, which receives the test data 112 from the test system 100. The multiplexing unit 102 makes it possible to utilize a data bus having a width of m tester channels in parallel for all the circuit units 101a–101n to be tested, in order to write test data 112 to the circuit units to be tested.

The test data 112 are predetermined by the test system 100 in a manner dependent on a test procedure to be performed.

According to the invention, a read-out of measurement data 101a–101n generated in a manner dependent on the test data 112 written in is effected on the one hand into a determining unit 103 and on the other hand in comparison units 104a–104n that are respectively assigned to the circuit units 101a–101n to be tested. According to the invention, then, the measurement data read out are not compared with expected data provided in the test system 100, but rather directly with expected data 111 obtained by means of the determining unit 103 on account of a majority decision.

Before the test procedure according to the invention is explained in more detail, the way in which the circuit units 101a–101n to be tested are connected to the determining unit 103 shall be explained with reference to FIG. 2. As already mentioned, each of the circuit units 101a–101n to be tested is connected to the test device via a connecting unit 106a–106n having a width of m tester channels 107a–107m.

Figure 2:
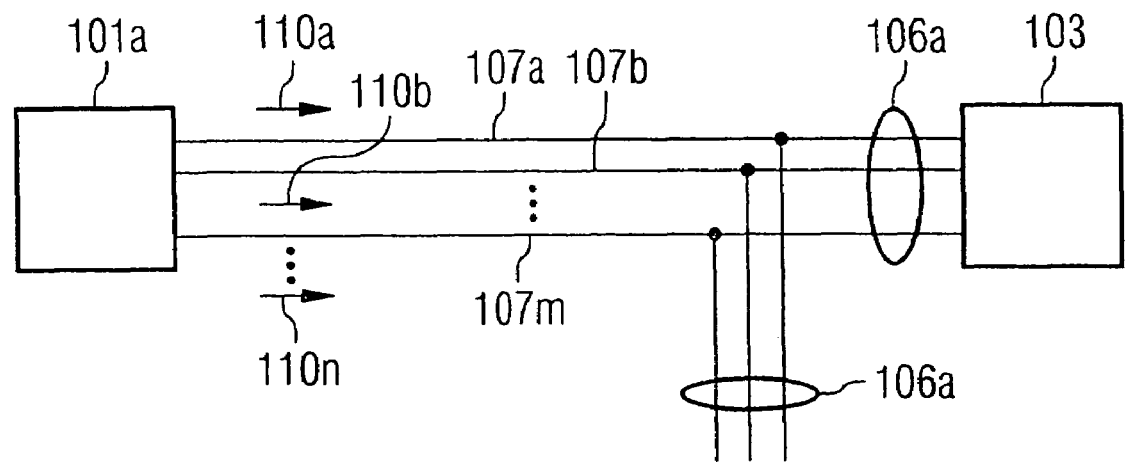
FIG. 2 shows a connecting unit for connecting a circuit unit to be tested to the test device in accordance with a portion (A) of FIG. 1.

For simplification, FIG. 2 merely illustrates the first circuit unit 101a to be tested with the first connecting unit 106a. The connecting unit 106a comprises a number of m tester channels 107a–107m. According to the invention, it is now possible to utilize all m tester channels 107a–107m in parallel for all the circuit units to be tested. The measurement data 110a–110n generated in the circuit units 101a–101n to be tested in a manner dependent on the test data 112 written in are output to the determining unit 103 for each circuit unit 101a–101n to be tested. The determining unit 103 is designed in such a way that it has an evaluation stage in which the measurement data 110a–110n obtained are evaluated with regard to a reciprocal correspondence.

Figure 3:
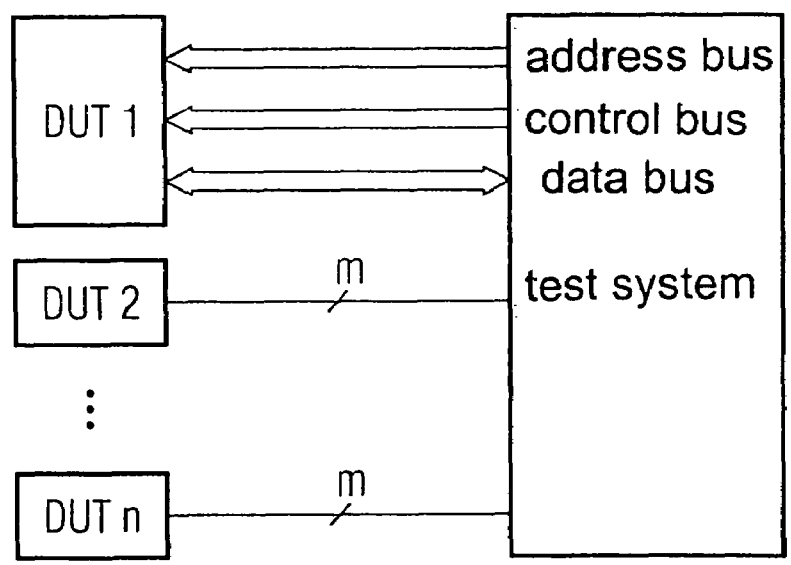
FIG. 3 shows a block diagram of a conventional test device.

The evaluation stage operates according to the principle of a majority decision, the expected data or an expected data word being found by virtue of the fact that a majority of the circuit units 101a–101n to be tested supply said data word during a test. The more circuit units 101a–101n to be tested are connected to the test device, the greater the reliability, therefore, of the measurement result with regard to the correct expected data 111. It should be pointed out that it is precisely the aim of the invention to connect a high number of circuit units 101a–101n to be tested to the test device since the advantage of the present invention is precisely a provision of a high parallelism when testing circuit units to be tested. This majority decision or this majority decision-making thus defines the expected data word, i.e. the expected data 111, which, as shown in FIG. 3, are transmitted via a bus having a width n to a buffer storage unit 105, in which the expected data 111 are buffer-stored.

Consequently, the expected data 111 are already present without the measurement data 110a–110n having to be returned to the test system 100 for each individual circuit unit 101a–101n to be tested. In order to test the individual circuit units 101a–101n to be tested with regard to their functionality, i.e. in order to compare the actual data (measurement data 110a–110n) with the desired data (expected data 111), use is made of individual comparison units 104a–104n respectively assigned to the circuit units 101a–101n to be tested. The multiplexing unit 102 is fed a write-read signal 113, which ensures that, in the event of test data 112 being written to the circuit units 101a–101n to be tested, the test data 112 are distributed between the corresponding circuit units 101a–101n to be tested, while in the event of a read operation the write-read signal 113 causes the multiplexing unit 102 to pass to the corresponding comparison units 104a–104n the measurement data 110a–110n generated by the circuit units 101a–101n to be tested in a manner dependent on the test data 112 written in.

Each comparison unit 104a–104n supplies comparison data 115a–115n in a manner dependent on the comparison in the course of which the measurement data 110a–110n generated in a manner dependent on the test data 112 written in with the expected data 111 which are fed to the comparison units 104a–104n in parallel from the buffer storage unit 105. The comparison data 115a–115n now supply a reliable statement about a functionality of the circuit unit 101a–101n that is respectively tested. FIG. 1 shows an additional block 114, which represents a comparison data storage unit in order to buffer-store the comparison data 115a–115n before the latter car be read out to the test system 100. Since a comparison of measurement data 110a–110n and expected data 111 has already been performed, a data bus having a significantly smaller width or a single line to the test system 100 suffices for transmitting the comparison data 115a–115n. The test system 100 generates test result data 109 in a manner dependent on the comparison data 115a–115n that are fed and outputs said data via an output unit 108.

It should be pointed out that the particular advantage of the test method according to the invention resides in the fact that the data streams output by the comparison units 104a–104n can be provided to a single line.

Furthermore, the data streams can advantageously be provided as a signal having a width of 1 bit since, when testing the circuit units to be tested, all that is important is whether the circuit units 101a–101n to be tested are free of defects or defective. The expected data 111 determined by a majority decision now make it possible to dispense with a transmission of a full width of the measurement data 110a–110n to the test system 100. In this way, it is possible to increase a parallelism of the test device, which leads to a reduction of test times and/or test costs.

With regard to the conventional test device for testing circuit units to be tested which is illustrated in FIG. 3, reference is made to the introduction to the description.

Although the present invention has been described above on the basis of preferred exemplary embodiments, it is not restricted thereto, but rather can be modified in diverse ways.

Moreover, the invention is not restricted to the application possibilities mentioned.

The invention claimed is:

1. Test device for testing circuit units to be tested, having:
   a) connecting units for connecting the circuit units to be tested to the test device;
   b) a test system, which
      (i) writes test data to the circuit units to be tested;
      (ii) reads out measurement data generated by the circuit units to be tested in a manner dependent on the test data written in; and
      (iii) compares the measurement data read out with defined expected data and provides test result data in a manner dependent on the comparison; and
   c) an output unit for outputting the test result data, characterized in that the test device further has:
   d) a determining unit for determining those of the measurement data which correspond for a predeterminable number of circuit units to be tested, and for defining the corresponding measurement data as the expected data; and
   e) comparison units for comparing the measurement data generated by the circuit units to be tested in a manner dependent on the test data written in with the expected data in order to obtain comparison data.

2. Device according to claim 1, characterized in that the connecting units for connecting the circuit units to be tested to the test device in each case comprise a predetermined number m of tester channels.

3. Device according to claim 1, characterized in that the predeterminable number of circuit units to be tested for which the measurement data correspond, said predeterminable number being determined in the determining unit, comprises a majority of the circuit units to be tested.

4. Device according to claim 1, characterized in that provision is made of a buffer storage unit for buffer storing the expected data determined.

5. Device according to claim 1, characterized in that a multiplexing unit is provided, which switches through the test data to the circuit units to be tested and outputs to the corresponding comparison units the measurement data generated by the circuit units to be tested in a manner dependent on the test data switched through.

6. Device according to claim 5, characterized in that the multiplexing unit switches through the test data to the circuit units to be tested in a manner dependent on a write-read signal fed to the multiplexing unit.

7. Device according to claim 6, characterized in that the multiplexing unit outputs to the corresponding comparison units, in a manner dependent on a write-read signal fed to the multiplexing unit, the measurement data generated by the circuit units to be tested in a manner dependent on the test data switched through.

8. Device according to claim 1, characterized in that provision is made of a comparison data storage unit for storing the comparison data.

9. Device according to claim 1, characterized in that provision is made of at least three connecting units for connecting at least three circuit units to be tested to the test device.

10. Test method for testing circuit units to be tested in a test device, having the following steps:
    a) connection of the circuit units to be tested to the test device by means of connecting units;
    b) performance of test procedures by means of a test system, the test system:
       (i) writes test data to the circuit units to be tested;
       (ii) reads out measurement data generated by the circuit units to be tested in a manner dependent on the test data written in; and
       (iii) compares the measurement data read out with defined expected data and provides test result data in a manner dependent on the comparison; and
    c) outputting of the test result data by means of an output unit,
    characterized in that
    the method further comprises the following steps:
    d) determination of those of the measurement data which correspond for a predeterminable number of circuit units to be tested, by means of a determining unit;
    e) definition of the corresponding measurement data as the expected data by means of the determining unit; and
    f) comparison of the measurement data generated by the circuit units to be tested in a manner dependent on the test data written in with the expected data by means of comparison units in order to obtain comparison data.

11. Method according to claim 10, characterized in that a majority decision is performed in the determining unit in such a way that the predeterminable number of circuit units to be tested for which the measurement data correspond, said number being determined in the determining unit, is defined as a plurality of the circuit units to be tested.

12. Method according to claim 10, characterized in that the expected data determined by means of the determining unit are buffer-stored in a buffer storage unit before they are output to the comparison units.

13. Method according to claim 10, characterized in that the test data are switched through to the circuit units to be tested by means of a multiplexing unit, and in that the measurement data generated by the circuit units to be tested in a manner dependent on the test data switched through are output to the corresponding comparison units.

14. Device according to claim 13, characterized in that the test data are switched through to the circuit units to be tested by means of the multiplexing unit in a manner dependent on a write-read signal fed to the multiplexing unit.

15. Device according to claim 14, characterized in that the measurement data generated by the circuit units to be tested in a manner dependent on the test data switched through are output to the corresponding comparison units by means of the multiplexing unit in a manner dependent on a write-signal fed to the multiplexing unit.

16. Method according to claim 10, characterized in that the comparison data are buffer-stored by means of a comparison data storage unit.

* * * * *